US009601534B2

(12) United States Patent
Sekine

(10) Patent No.: US 9,601,534 B2
(45) Date of Patent: Mar. 21, 2017

(54) SOLID STATE IMAGE SENSOR, METHOD OF MANUFACTURING SOLID STATE IMAGE SENSOR, AND IMAGE CAPTURING SYSTEM

(71) Applicant: CANON KABUSHIKI KAISHA, Tokyo (JP)

(72) Inventor: Yasuhiro Sekine, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/010,340

(22) Filed: Jan. 29, 2016

(65) Prior Publication Data

US 2016/0233259 A1    Aug. 11, 2016

(30) Foreign Application Priority Data

Feb. 10, 2015    (JP) .................................. 2015-024694

(51) Int. Cl.
*H01L 31/0232*    (2014.01)
*H01L 27/146*    (2006.01)

(52) U.S. Cl.
CPC .. *H01L 27/14627* (2013.01); *H01L 27/14605* (2013.01); *H01L 27/14685* (2013.01)

(58) Field of Classification Search
CPC ......... H01L 27/14627; H01L 27/14685; H01L 27/14621; H01L 27/14636
See application file for complete search history.

(56) References Cited

U.S. PATENT DOCUMENTS

2012/0200728 A1*  8/2012  Kobayashi ........ H01L 27/14623
                                                             348/222.1
2015/0214270 A1    7/2015  Yomori et al.
2015/0346547 A1* 12/2015  Wakabayashi .... G02F 1/133526
                                                             349/95

FOREIGN PATENT DOCUMENTS

JP     2007-335723 A     12/2007
JP     2008-193383 A      8/2008

OTHER PUBLICATIONS

Kawabata et al., U.S. Appl. No. 14/836,124, filed Aug. 26, 2015.

* cited by examiner

*Primary Examiner* — Thanh Y Tran
(74) *Attorney, Agent, or Firm* — Fitzpatrick, Cella, Harper & Scinto

(57) ABSTRACT

The present invention provides a solid state image sensor including a pixel array having a plurality of pixels arranged therein, each of the plurality of pixels including a photoelectric conversion device and a microlens configured to guide incident light to the photoelectric conversion device, the microlens having a lower surface, on an exit side of the incident light, which has a convex shape with respect to the photoelectric conversion device, with a vertex of the convex shape shifting from a center position of the microlens to a central side of the pixel array.

16 Claims, 7 Drawing Sheets

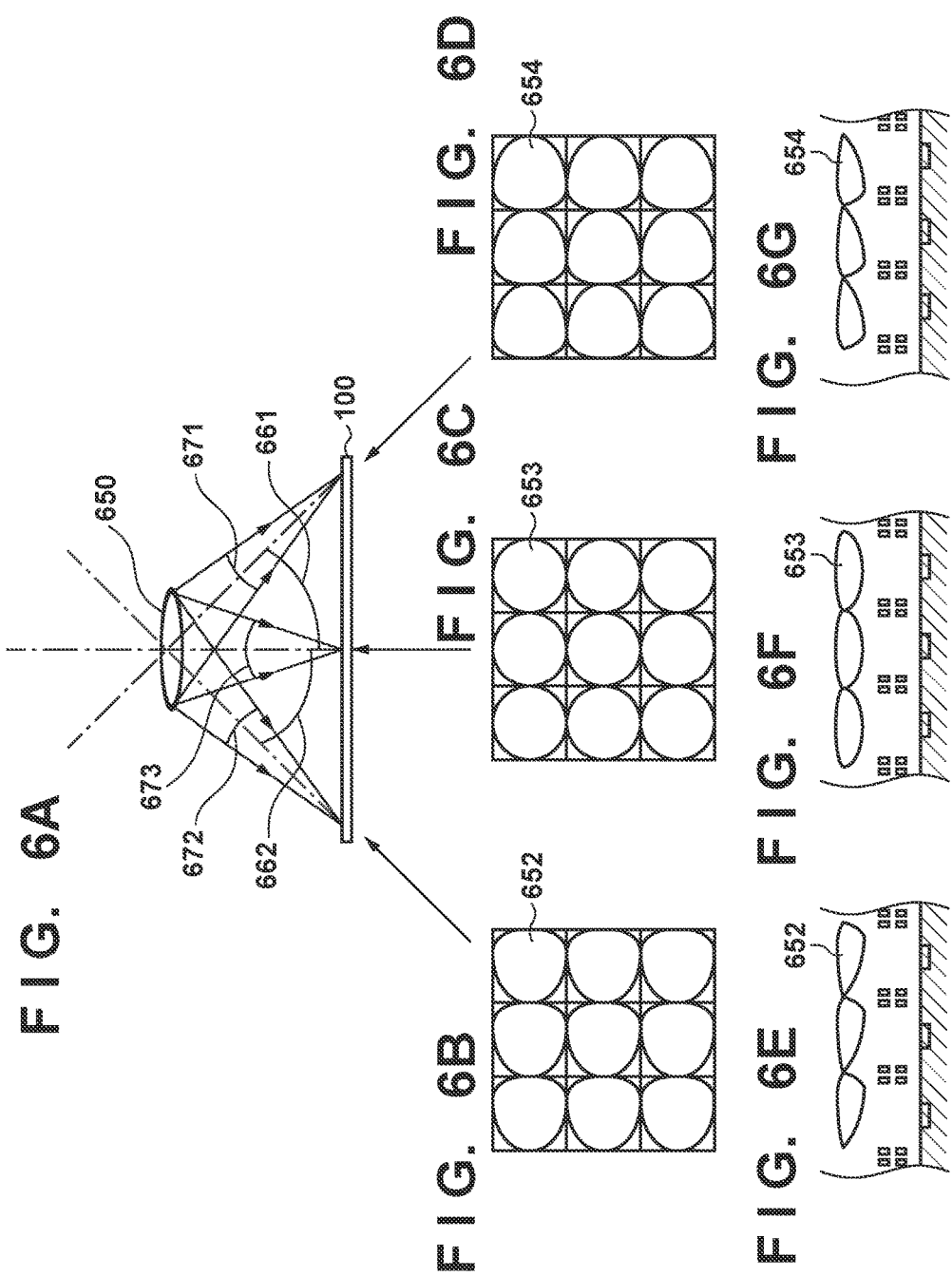

SOLID STATE IMAGE SENSOR, METHOD OF MANUFACTURING SOLID STATE IMAGE SENSOR, AND IMAGE CAPTURING SYSTEM

BACKGROUND OF THE INVENTION

Field of the Invention

The present invention relates to a solid state image sensor, a method of manufacturing a solid state image sensor, and an image capturing system.

Description of the Related Art

Solid state image sensors and display apparatuses use optical elements such as microlens arrays as disclosed in Japanese Patent Laid-Open No. 2007-335723. Japanese Patent Laid-Open No. 2007-335723 discloses a technique of providing microlenses, each having a shape called a teardrop, in a solid state image sensor to efficiently focus light entering from oblique directions onto light-receiving units. Such a microlens is shaped to have a curved shape tapering to the outside of the solid state image sensor and having a vertex at an outside end portion when viewed in a planar view.

In principle, however, each microlens having the teardrop shape disclosed in Japanese Patent Laid-Open No. 2007-335723 cannot cause part of light entering the microlens to enter the corresponding light-receiving unit, that is, cannot contribute to the focusing of light, depending on the incident position of light. In addition, such light is likely to enter the regions of adjacent pixels and become stray light, leading to deterioration in the sensitivity and image quality of the solid state image sensor.

SUMMARY OF THE INVENTION

The present invention provides a solid state image sensor advantageous in reducing deterioration in sensitivity and image quality.

According to one aspect of the present invention, there is provided a solid state image sensor including a pixel array having a plurality of pixels arranged therein, each of the plurality of pixels including a photoelectric conversion device and a microlens configured to guide incident light to the photoelectric conversion device, the microlens having a lower surface, on an exit side of the incident light, which has a convex shape with respect to the photoelectric conversion device, with a vertex of the convex shape shifting from a center position of the microlens to a central side of the pixel array.

Further aspects of the present invention will become apparent from the following description of exemplary embodiments with reference to the attached drawings.

BRIEF DESCRIPTION OF THE DRAWINGS

FIGS. 6A to 6G are views each showing how light from an imaging lens enters a solid state image sensor.

DESCRIPTION OF THE EMBODIMENTS

Figure 1B:
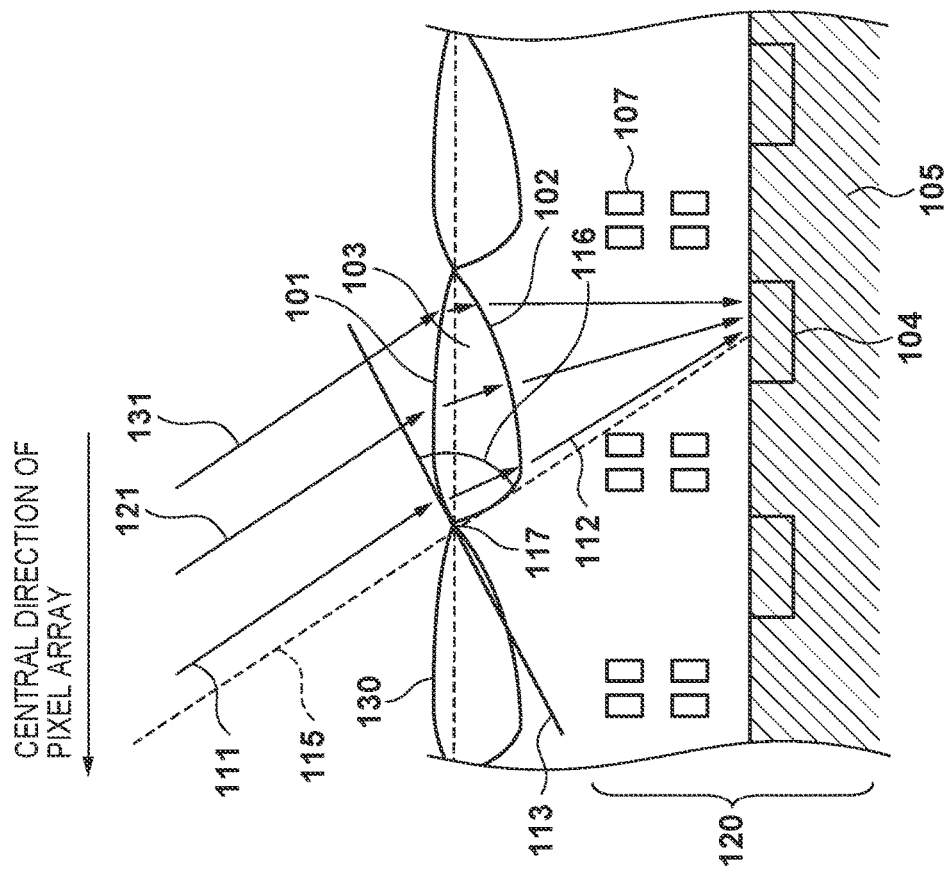
FIGS. 1A and 1B are schematic views showing the arrangement of a solid state image sensor according to one aspect of the present invention.

Preferred embodiments of the present invention will be described below with reference to the accompanying drawings. Note that the same reference numerals denote the same members throughout the drawings, and a repetitive description thereof will not be given.

<First Embodiment>

Figure 1A:
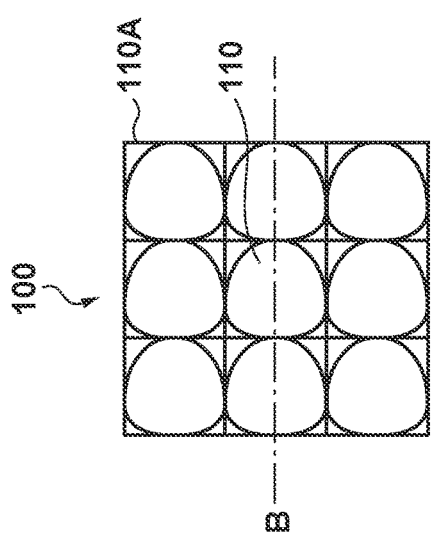

FIGS. 1A and 1B are schematic views showing the arrangement of a solid state image sensor 100 according to one aspect of the present invention. FIG. 1A is a plan view of the solid state image sensor 100. FIG. 1B is a sectional view taken along a chain line B of the solid state image sensor 100 shown in FIG. 1A. As shown in FIG. 1A, the solid state image sensor 100 includes a pixel array 110A in which a plurality of pixels 110 are arranged.

As shown in FIG. 1B, a solid state image sensor substrate 120 forming the solid state image sensor 100 includes a semiconductor substrate 105, photoelectric conversion devices (light-receiving units) 104 formed in the semiconductor substrate 105, and a wiring layer 107 in which transistors (not shown) and wirings are formed. The solid state image sensor 100 implements a function of reading out light (incident light) entering each photoelectric conversion device 104 as an electrical signal upon photoelectric conversion. Microlenses 103 which guide incident light to the photoelectric conversion devices 104 are formed on the upper portion of the solid state image sensor substrate 120. In addition, the leftward direction in FIG. 1B coincides with the central direction of the pixel array 110A (solid state image sensor 100).

In this embodiment, the microlenses 103 of some of the plurality of pixels 110 have a surface shape satisfying the following conditions. In this case, the microlenses 103 of some pixels are microlenses provided in a peripheral region surrounding a central region including the center of the pixel array 110A.

The surface of each microlens 103 which is located on the incident side of incident light, that is, an upper surface 101, will be described. A virtual plane 113 in contact with the upper surface 101 at an end portion 117 on the central side of the pixel array 110A of the microlens 103 is defined. The end portion 117 is also a contact point between the virtual plane 113 and the microlens 103 (upper surface 101). An angle 116 defined between a straight line extending from the end portion 117 along the virtual plane 113 so as to extend from the central side to the outside of the pixel array 110A and a straight line 115 connecting the end portion 117 and the center of the photoelectric conversion device 104 is 90° or less.

Assume that straight line extending from the end portion 117 along the virtual plane 113 so as to extend from the central side to the outside of the pixel array 110A is perpendicular to the straight line 115 connecting the end portion 117 and the center of the photoelectric conversion device 104, that is, the angle 116 is 90°. In this case, incident light 111 entering the microlens 103 along the straight line 115 enters the center of the photoelectric conversion device 104.

The surface of each microlens 103 which is located on the exit side of incident light, that is, a lower surface 102, will be described. The lower surface 102 of the microlens 103 has an asymmetrical shape with a position nearest to the photoelectric conversion device 104 (a position at which the thickness from a center plane 130 of the microlens 103 is the maximum) shifting from the center position of the microlens 103 to the central side of the pixel array 110A. The lower surface 102 of the microlens 103 has a convex shape with respect to the photoelectric conversion device 104.

Each microlens 103 is formed from a material having a higher refractive index than a material in contact with the lower surface 102 at a position between the microlens 103 and the photoelectric conversion device 104. The microlens 103 is formed from, for example, a color filter material.

Referring to FIG. 1B, the upper surface 101 of each microlens 103 has a convex shape with respect to the incident side of incident light. The incident light 111, incident light 121, and incident light 131 entering the microlens 103 from the same direction as that of the straight line 115 are each refracted by the upper surface 101 of the microlens 103 and focused onto the photoelectric conversion device 104. In this case, if the upper surface 101 of the microlens 103 lacks in refractive power with an increase in curvature radius, the lower surface 102 of the microlens 103 compensates for the refractive power to cause the incident light 111, 121, and 131 to enter the photoelectric conversion device 104. At this time, the refractive power of the lower surface 102 of the microlens 103 is larger than that of the upper surface 101 of the microlens 103. As described above, the microlens 103 can focus incident light onto the photoelectric conversion device 104 by using the upper surface 101 having a convex shape extending upward and the lower surface 102 having a convex shape extending downward with respect to the center plane 130.

Figure 2:
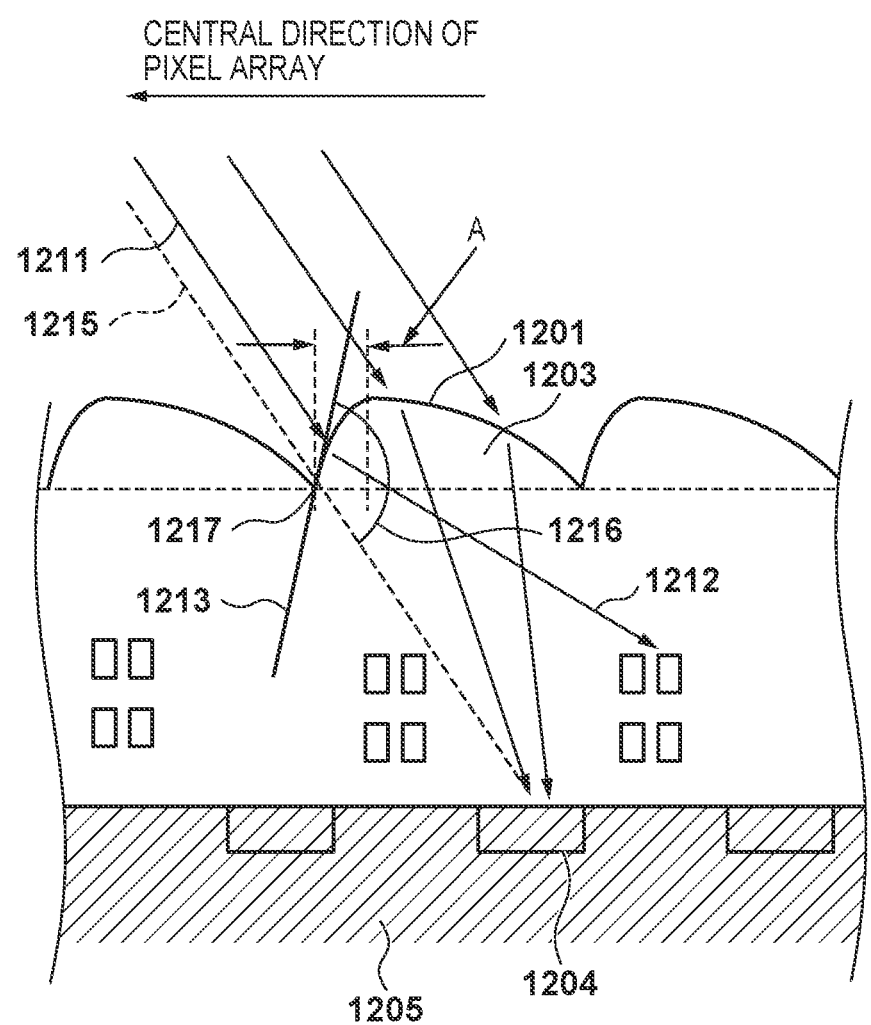
FIG. 2 is a schematic view showing the arrangement of a solid state image sensor according to the related art.

In contrast, in a conventional solid state image sensor, as shown FIG. 2, each microlens 1203 is configured such that an angle 1216 defined between a straight line defining a virtual plane 1213 and a straight line 1215 connecting an end portion 1217 and the center of a photoelectric conversion device 1204 is larger than 90°. In this case, the virtual plane 1213 is a plane of the microlens 1203 which is in contact with an upper surface 1201 at the end portion 1217 on the central side of the pixel array.

In the arrangement shown in FIG. 2, incident light 1211, of incident light entering each microlens 1203, which enters region A is refracted rightward by the upper surface 1201 of the microlens 1203 and propagates along an arrow 1212 to enter the region of an adjacent pixel. In this arrangement, it is difficult to perform optical design so as to cause the incident light 1211 refracted by the upper surface 1201 of the microlens 1203 to enter a photoelectric conversion device 1204 by forming a lens shape on the lower surface side of the microlens 1203. In principle, it is difficult for the microlens 1203 according to the related art to focus the incident light 1211 entering region A onto the photoelectric conversion device 1204.

Figure 3:
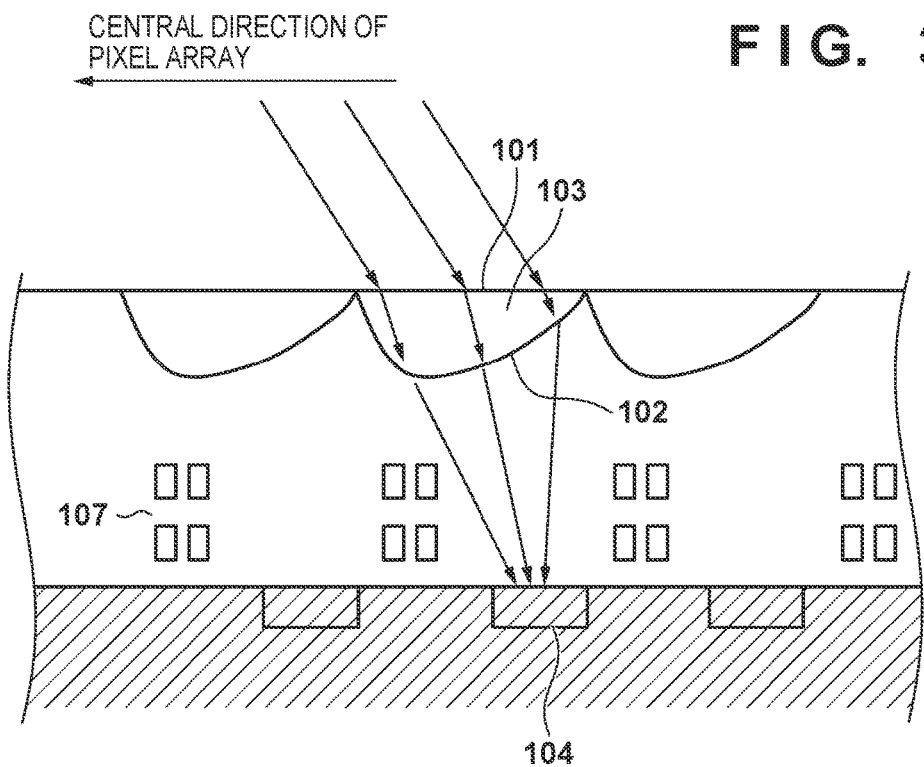
FIG. 3 is a schematic view showing the arrangement of a solid state image sensor according to one aspect of the present invention.

In this embodiment, as shown in FIG. 3, the upper surface 101 of each microlens 103 may have a planar shape (flat shape). An arrangement in which the upper surface 101 of each microlens 103 has a planar shape is equivalent to an arrangement in which the virtual plane 113 coincides with the upper surface 101 of the microlens 103 in FIG. 1B.

Figure 4:
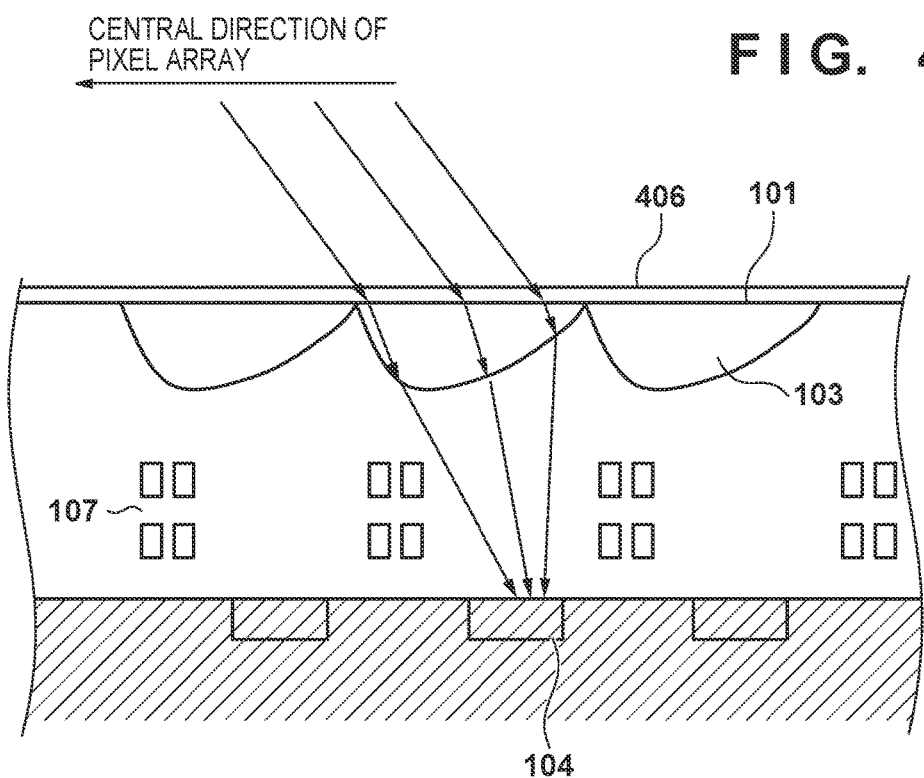
FIG. 4 is a schematic view showing the arrangement of a solid state image sensor according to one aspect of the present invention.

As shown in FIG. 4, an antireflection film 406 which reduces the reflection of incident light by the upper surface 101 may be formed (deposited) on the upper surface 101 of each microlens 103, which has a planar shape. The upper surface of a microlens used in general has a convex shape. For this reason, an antireflection film formed on the upper surface changes in thickness in accordance with positions on the convex shape. It is therefore very difficult to form an antireflection film on the entire upper surface of the microlens so as to have a uniform thickness complying with an antireflection condition. In contrast, as shown in FIG. 4, when the upper surface 101 of each microlens 103 has a planar shape, it is possible to form the antireflection film 406 on the entire upper surface 101 so as to have a uniform thickness complying with an antireflection condition. This makes it possible to effectively reduce the reflectance of the upper surface 101 of the microlens 103, improve the sensitivity of the solid state image sensor 100, and suppress the generation of ghost and flare caused by reflected light from the upper surface 101 of the microlens 103.

Figure 5:
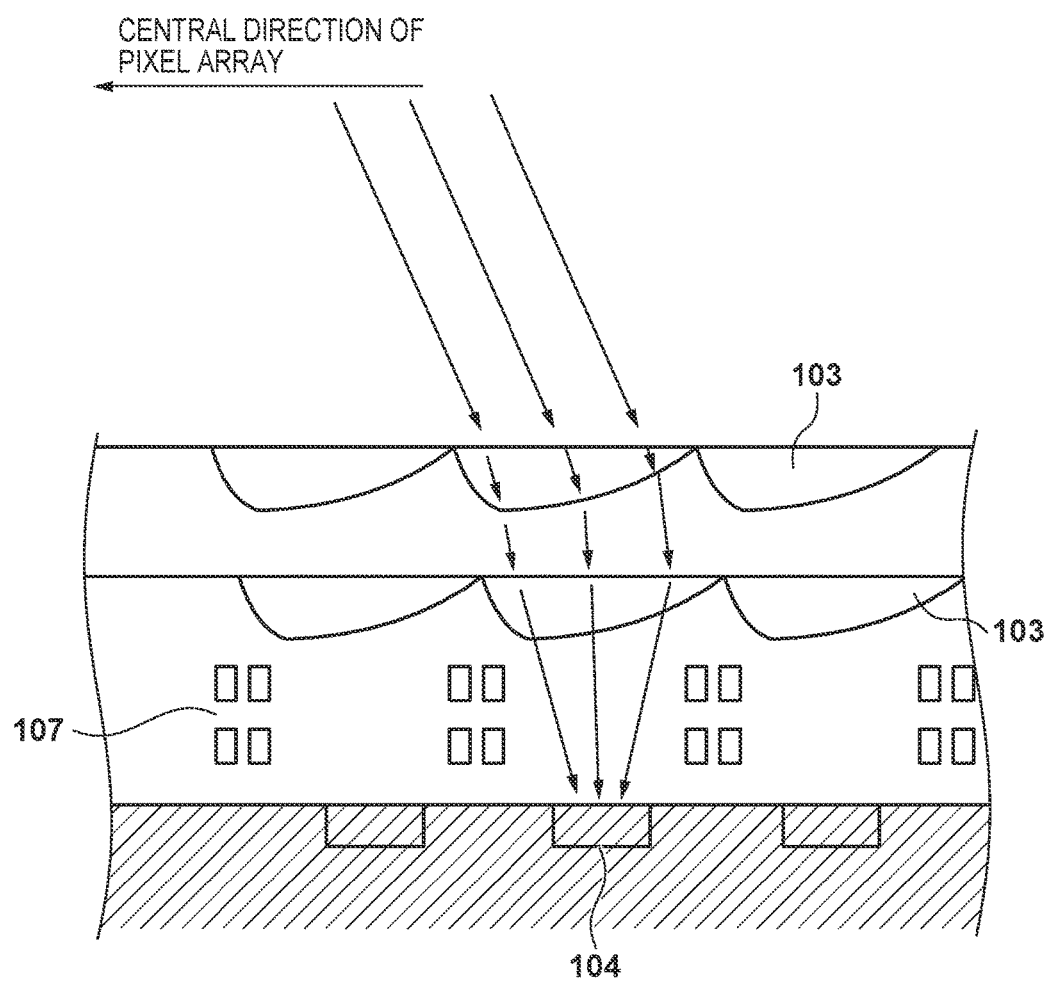
FIG. 5 is a schematic view showing the arrangement of a solid state image sensor according to one aspect of the present invention.

FIG. 5 shows the arrangement of a solid state image sensor using the microlenses 103, each having the upper surface 101 with the planar shape shown in FIG. 3, as top lenses and intra-layer lenses. This arrangement can cause incident light entering each pixel on the peripheral portion of the pixel array 110A to enter the corresponding photoelectric conversion device 104 more vertically. This makes it possible to reduce the vignetting of incident light by the wiring layer 107. Referring to FIG. 5, the microlenses 103 are used as both the top lenses and the intra-layer lenses. However, it is possible to use general microlenses as either the top lenses or the intra-layer lenses. As described above, the solid state image sensor may be provided with the microlenses 103 at least on the uppermost layer on the incident side of incident light or between the uppermost layer and the wiring layer 107.

FIG. 6A is a view showing how light (incident light) from an imaging lens 650 enters the solid state image sensor 100. FIGS. 6C and 6F are respectively a plan view and a sectional view of microlenses 653 arranged in a central region including the center of the pixel array 110A in the solid state image sensor 100. In the central region including the center of the pixel array 110A, light propagating from the exit pupil of the imaging lens 650 in the vertical direction and light having a spread angle 673 corresponding to the f-number of the imaging lens 650 enter the microlenses. Therefore, each microlens 653 preferably has a symmetrical shape. In this embodiment, as shown in FIGS. 6C and 6F, a spherical lens is used as the microlens 653.

FIGS. 6B and 6E are respectively a plan view and a sectional view of microlenses 652 arranged in a peripheral region located on the left end and surrounding the central region including the center of the pixel array 110A in the solid state image sensor 100. In the peripheral region on the left end of the pixel array 110A, light having a principal ray angle 662 from the exit pupil of the imaging lens 650 and light having a spread angle 672 corresponding to the f-number of the imaging lens 650 enter the microlenses. Each microlens 652 therefore needs to efficiently focus light entering from an obliquely upper right position onto the corresponding photoelectric conversion device. In this case, as each microlens 652, the above microlens 103 is preferably used. In this embodiment, as shown in FIG. 6B, each microlens 652 has an asymmetrical shape, when viewed in a planar view, such that the occupation ratio to the area of the pixel increases toward the central side of the pixel array 110A. In addition, as shown in FIG. 6E, each microlens 652 has an asymmetrical shape, when viewed in a sectional view, such that a position nearest to the photoelectric conversion device (a vertex of a convex shape) shifts from the center position of the microlens 652 to the central side of the pixel array 110A. Furthermore, the microlens 652 may be arranged such that its position on a plane shifts from the position of the corresponding photoelectric conversion device to the central side of the pixel array 110A.

FIGS. 6D and 6G are respectively a plan view and a sectional view of microlenses 654 arranged in a peripheral region located on the right end and surrounding the central region including the center of the pixel array 110A in the solid state image sensor 100. In the peripheral region on the right end of the pixel array 110A, light having a principal ray angle 661 from the exit pupil of the imaging lens 650 and light having a spread angle 671 corresponding to the f-number of the imaging lens 650 enter the microlenses. Each microlens 654 therefore needs to efficiently focus light entering from an obliquely upper left position onto the corresponding photoelectric conversion device. In this case, as each microlens 654, the above microlens 103 is preferably used. Note that the shape and arrangement of the microlenses 654 are laterally inverted with respect to those of the microlenses 652 described above, and hence a detailed description of them will be omitted.

In addition, referring to FIG. 6A, in the solid state image sensor 100, the shape and arrangement of the microlenses may continuously change from the central region including the center of the pixel array 110A to the peripheral regions on the left and right ends. Alternatively, the region extending from the central region including the center of the pixel array 110A to the peripheral regions on the left and right ends may be segmented into several blocks, and the shape and arrangement of the microlenses may be changed for each block.

As described above, in this embodiment, each pixel on the peripheral side of the solid state image sensor 100 is provided with the microlens 103 having an asymmetrical shape such that a position nearest to the photoelectric conversion device 104 (a vertex of a convex shape) is shifted to the central side of the pixel array 110A. In addition, the angle 116 defined between the straight line defining the virtual plane 113 in contact with the upper surface 101 on the end portion 117, of each microlens 103, which is located on the central side of the pixel array 110A, and the straight line 115 connecting the end portion 117 and the center of the photoelectric conversion device 104 is set to be 90° or less. This enables the microlens 103 to efficiently focus incident light obliquely entering from the central side of the pixel array 110A onto the photoelectric conversion device 104. This makes it possible to reduce stray light entering adjacent pixels. Therefore, the solid state image sensor 100 can implement high sensitivity and high image quality.

<Second Embodiment>

A method of manufacturing a solid state image sensor 100 according to one aspect of the present invention will be described with reference to FIGS. 7A to 7E. First of all, photoelectric conversion devices 104, transistors (not shown), a wiring layer 107, and the like are formed in and on a semiconductor substrate 105 by using techniques known in the art, thereby preparing a solid state image sensor substrate 120.

Figure 7A:
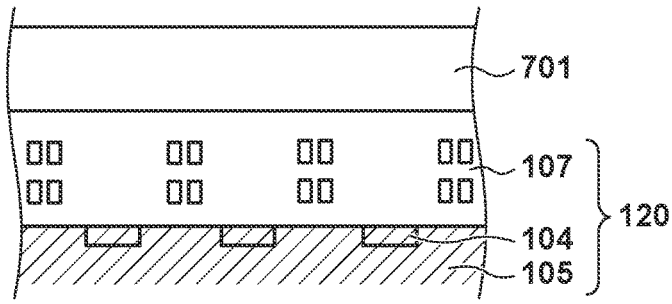
FIGS. 7A to 7E are views for explaining a method of manufacturing a solid state image sensor according to one aspect of the present invention.

As shown in FIG. 7A, the surface of the solid state image sensor substrate 120 is coated with a photoresist (photoresist film) 701 for the formation of a second lens material having a lower refractive index than a first lens material formed in a subsequent process.

Figure 7B:
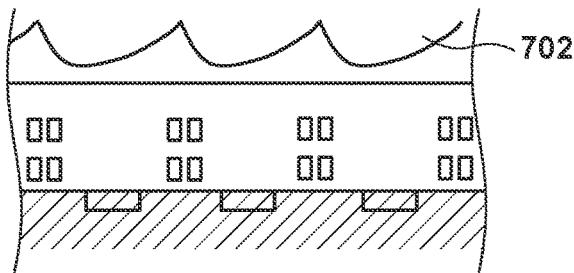

Subsequently, the photoresist 701 applied on the surface of the solid state image sensor substrate 120 is exposed and developed by using a mask exhibiting a continuous tone change. Such a mask is a mask for the formation of microlenses 103. For example, this mask includes a gray mask or an area tone mask which is formed from a light-shielding film having a lower resolution than an exposure apparatus and allows irradiation of an imaging plane with light having a continuous tone by changing the density distribution of dots. As shown in FIG. 7B, concave portions 702, each corresponding to the shape of a lower surface 102 of each microlens 103, are formed on the surface of the photoresist 701 by exposing and developing the photoresist 701.

The purpose of using a gray mask or area tone mask when exposing the photoresist 701 is to form microlenses having an arbitrary shape at arbitrary positions on the solid state image sensor substrate 120. The surface of the solid state image sensor substrate 120 has gone through a process of forming a dielectric interlayer and a planarization process after the formation of the wiring layer 107, and hence has excellent flatness. Therefore, the surface of the solid state image sensor substrate 120 can be coated with the photoresist 701 with a uniform thickness. The photoresist 701 is exposed by using a gray mask or area tone mask having a transmittance distribution for the formation of a predetermined resist shape. This makes it possible to form a predetermined resist shape at an arbitrary position on the solid state image sensor substrate 120 regardless of the structure of the solid state image sensor substrate 120.

Figure 7C:
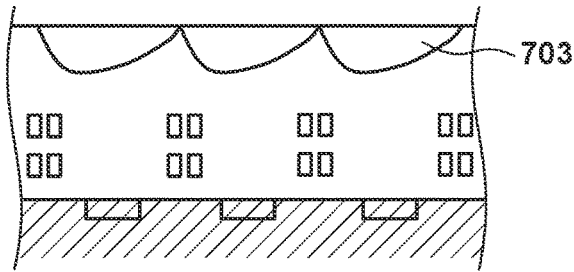

An annealing process, a UV curing process, and the like are performed with respect to the photoresist 701, in which the concave portions 702 are formed, to stabilize the photoresist 701. As shown in FIG. 7C, the concave portions 702 are filled with a first lens material having a higher refractive index than a second lens material to planarize the surface, thereby forming microlenses 703 made of the first lens material.

Figure 7D:
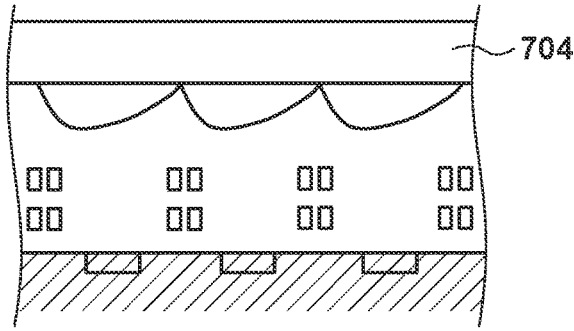
Figure 7E:
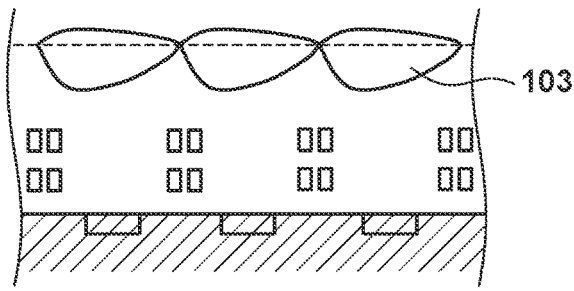

Subsequently, as shown in FIG. 7D, the surface of each microlens 703 is coated with a photoresist (photoresist film) 704 having the same refractive index as that of the first lens material. As in the same manner described above, exposure and development by using a mask exhibiting a continuous tone change, an annealing process, a UV curing process, and the like are performed with respect to the photoresist 704 to form the microlens 103, as shown in FIG. 7E.

With the respective processes shown in FIGS. 7A to 7E, the solid state image sensor 100 having high sensitivity and high image quality can be manufactured.

Another method of manufacturing the solid state image sensor 100 according to one aspect of the present invention will be described with reference to FIGS. 8A to 8E. First of all, the photoelectric conversion devices 104, transistors (not shown), the wiring layer 107, and the like are formed in and on the semiconductor substrate 105 by using techniques known in the art, thereby preparing the solid state image sensor substrate 120.

Figure 8A:
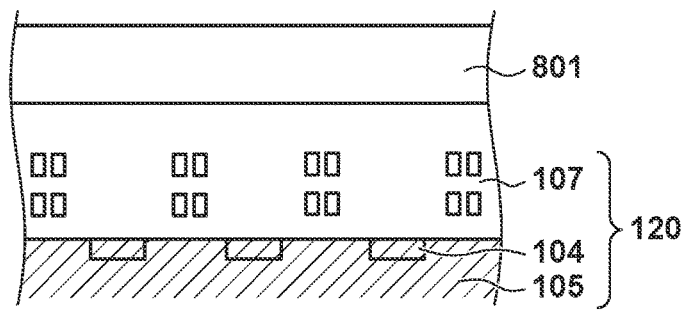
FIGS. 8A to 8E are views for explaining a method of manufacturing a solid state image sensor according to one aspect of the present invention.

As shown in FIG. 8A, the surface of the solid state image sensor substrate 120 is coated with a film 801 made of a fourth lens material having a lower refractive index than that of a third lens material formed in a subsequent process. In this case, as the fourth lens material, for example, silicon oxide having a refractive index of 1.46 is used.

Figure 8B:
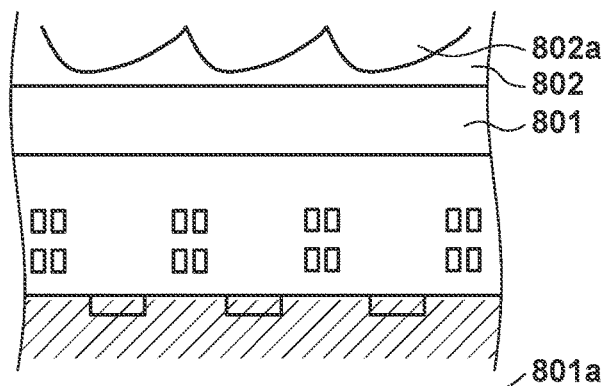

As shown in FIG. 8B, the surface of the film 801 made of the fourth lens material is then coated with a photoresist (photoresist film) 802. The photoresist 802 is exposed and developed by using a mask (a gray mask or area tone mask)

exhibiting a continuous tone change to form concave portions 802a in the surface of the photoresist 802. The purpose of using a gray mask or area tone mask is to form microlenses having an arbitrary shape at arbitrary positions on the solid state image sensor substrate 120.

Figure 8C:
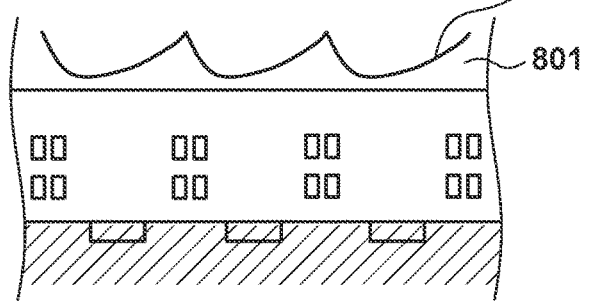

The film 801 made of the fourth lens material is etched by using the photoresist 802, in which the concave portions 802a are formed, as an etching mask to transfer the concave portions 802a, formed in the photoresist 802, to the film 801 made of the fourth lens material. With this process, as shown in FIG. 8C, concave portions 801a to be filled with the third lens material are formed in the surface of the film 801 made of the fourth lens material. In this case, as etching, dry etching is used, which enables etching with strong anisotropy.

Figure 8D:
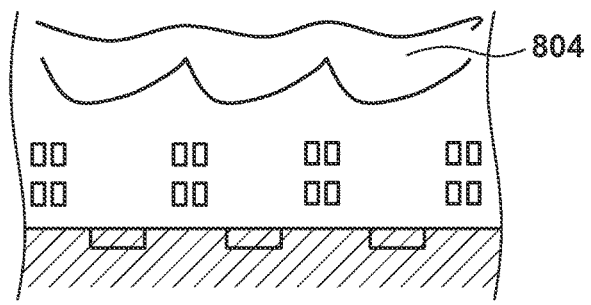

As shown in FIG. 8D, a film 804 made of the third lens material is formed (deposited) on the surface of the film 801 made of the fourth lens material, in which the concave portions 801a are formed. As the third lens material, for example, silicon nitride having a refractive index of 2.0 is used.

Figure 8E:
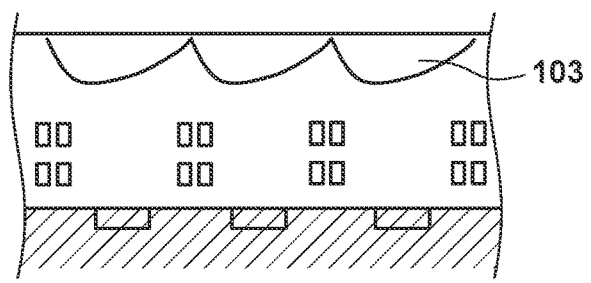

Subsequently, as shown in FIG. 8E, the surface of the film 804 is polished and planarized by using a chemical or mechanical polishing method to form the microlenses 103 each having an upper surface 101 with a planar shape. In this manner, even with the use of a material which is not provided as a photosensitive resin material, the microlenses 103 can be formed by transferring a resist shape by etching.

With the respective processes shown in FIGS. 8A to 8E, the solid state image sensor 100 having high sensitivity and high image quality can be manufactured.

Any materials can be used as the first, second, third, and fourth lens materials as long as their refractive indices satisfy the relation of (first lens material)>(second lens material) and (third lens material)>(fourth lens material). For example, a color resist can be used as the first and third lens materials, and a transparent planarization material or silicon oxide can be used as the second and fourth lens materials. In this case, each microlens can also serve as a color filter. This can contribute to a reduction in the profile of a solid state image sensor. It is therefore possible to improve the sensitivity of a solid state image sensor and reduce the number of processes, thus also providing advantages in terms of manufacture.

<Image Capturing System>

The solid state image sensors described in the above embodiments can be applied to image capturing systems typified by cameras and the like. The concept of an image capturing system includes not only an apparatus mainly aiming at image capturing but also an apparatus (for example, a personal computer or portable terminal) accessorily having an image capturing function.

The image capturing system includes the solid state image sensor according to the present invention exemplified as each embodiment described above, and a signal processing unit which processes a signal output from the solid state image sensor. The signal processing unit can include, for example, an A/D converter and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-024694 filed on Feb. 10, 2015, which is hereby incorporated by reference herein in its entirety.

What is claimed is:

1. A solid state image sensor comprising a pixel array having a plurality of pixels,
   each of the plurality of pixels including a photoelectric conversion device and a microlens configured to guide incident light to the photoelectric conversion device,
   the microlens having a lower surface, on an exit side of the incident light, which has a convex shape with respect to the photoelectric conversion device,
   wherein a vertex of the convex shape is closer to a first end portion of the microlens than to a second end portion of the microlens along a direction toward a central side of the pixel array, and
   wherein the first end portion is closer to the central side of the pixel array than the second end portion along the direction toward the central side of the pixel array.

2. The sensor according to claim 1, wherein a material forming the microlens has a higher refractive index than a material in contact with the lower surface between the microlens and the photoelectric conversion device.

3. The sensor according to claim 1, wherein the microlens has an upper surface, on an incident side of the incident light, which has a convex shape with respect to the incident side of the incident light.

4. The sensor according to claim 3, wherein a refractive power of the lower surface of the microlens is larger than a refractive power of the upper surface.

5. The sensor according to claim 1, wherein the microlens has an upper surface, on an incident side of the incident light, which has a planar shape.

6. The sensor according to claim 5, wherein an antireflection film which reduces reflection of the incident light on the upper surface is formed on the upper surface of the microlens.

7. The sensor according to claim 1, wherein the microlens includes a microlens provided in a peripheral region surrounding a central region including a center of the pixel array.

8. The sensor according to claim 1, wherein the microlens comprises a color filter material.

9. The sensor according to claim 1, wherein an angle defined between a straight line defining a virtual plane in contact with an upper surface of the microlens on an incident side of the incident light at the first end portion and a straight line connecting the first end portion and a center of the photoelectric conversion device is 90° or less.

10. The sensor according to claim 1, further comprising a wiring layer on which wirings are formed,
    wherein the microlens is provided at least on an uppermost layer on the incident side of the incident light or between the uppermost layer and the wiring layer.

11. A method of manufacturing a solid state image sensor comprising a pixel array having a plurality of pixels, each of the plurality of pixels including a photoelectric conversion device and a microlens configured to guide incident light to the photoelectric conversion device, the method comprising:
    coating a substrate for formation of the pixel array with a photoresist;
    forming a concave portion in the photoresist by exposing the photoresist using a mask for formation of the microlens; and
    forming the microlens which is formed from a lens material having a higher refractive index than the photoresist by filling the concave portion with the lens material and has a convex shape with respect to the photoelectric conversion device, wherein a vertex of the convex shape is closer to a first end portion of the microlens than to a second end portion of the microlens along a direction toward a central side of the pixel array, and wherein the first end portion is closer to the central side of the pixel array than the second end portion along the direction toward the central side of the pixel array.

12. The method according to claim 11, wherein the mask exhibits a continuous tone change.

13. A method of manufacturing a solid state image sensor comprising a pixel array having a plurality of pixels, each of the plurality of pixels including a photoelectric conversion device and a microlens configured to guide incident light to the photoelectric conversion device, the method comprising:

forming a first lens material on a substrate for formation of the pixel array;

coating the first lens material with a photoresist;

forming a concave portion in the photoresist by exposing the photoresist by using a mask for formation of the microlens;

transferring the concave portion to the first lens material by etching the first lens material by using the photoresist in which the concave portion is formed as an etching mask; and forming the microlens which is formed from a second lens material having a higher refractive index than the first lens material by filling a concave portion transferred to the first lens material with the second lens material and has a convex shape with respect to the photoelectric conversion device, wherein a vertex of the convex shape is closer to a first end portion of the microlens than to a second end portion of the microlens along a direction toward a central side of the pixel array, and wherein the first end portion is closer to the central side of the pixel array than the second end portion along the direction toward the central side of the pixel array.

14. The method according to claim 13, further comprising planarizing a surface of the second lens material by polishing the surface of the second lens material.

15. The method according to claim 13, wherein the etching includes dry etching.

16. An image capturing system comprising:

a solid state image sensor; and a signal processing unit configured to process a signal output from the solid state image sensor, wherein the solid state image sensor includes a pixel array having a plurality of pixels, each of the plurality of pixels includes a photoelectric conversion device and a microlens configured to guide incident light to the photoelectric conversion device, and the microlens has a lower surface, on an exit side of the incident light, which has a convex shape with respect to the photoelectric conversion device, wherein a vertex of the convex shape is closer to a first end portion of the microlens than to a second end portion of the microlens along a direction toward a central side of the pixel array, and wherein the first end portion is closer to the central side of the pixel array than the second end portion along the direction toward the central side of the pixel array.

* * * * *